US008447133B2

(12) United States Patent
Rieger et al.

(10) Patent No.: US 8,447,133 B2
(45) Date of Patent: May 21, 2013

(54) METHOD FOR DETERMINING DISTORTIONS IN A PARTICLE-OPTICAL APPARATUS

(75) Inventors: Bernd Rieger, Delft (NL); Michiel Van Der Stam, Best (NL)

(73) Assignee: FEI Company, Hillsboro, OR (US)

( * ) Notice: Subject to any disclaimer, the term of this patent is extended or adjusted under 35 U.S.C. 154(b) by 513 days.

(21) Appl. No.: 12/636,592

(22) Filed: Dec. 11, 2009

(65) Prior Publication Data
US 2010/0246993 A1 Sep. 30, 2010

(30) Foreign Application Priority Data

Dec. 12, 2008 (EP) .................................... 08171413

(51) Int. Cl.
*G06K 9/40* (2006.01)
*G06K 9/32* (2006.01)

(52) U.S. Cl.
USPC ............ 382/275; 382/254; 382/294; 382/295

(58) Field of Classification Search
USPC .......... 382/128–134, 275, 294–295; 250/306, 250/307, 311, 310, 396
See application file for complete search history.

(56) References Cited

U.S. PATENT DOCUMENTS

| 5,221,844 | A | | 6/1993 | van der Mast et al. |
| 5,448,063 | A | | 9/1995 | de Jong et al. |
| 5,581,347 | A | | 12/1996 | Le Saux et al. |
| 5,627,373 | A | * | 5/1997 | Keese ........................... 250/310 |
| 5,838,011 | A | * | 11/1998 | Krijn et al. ................. 250/396 R |
| 5,986,269 | A | * | 11/1999 | Krijn et al. ................. 250/396 R |
| 6,184,975 | B1 | * | 2/2001 | Henstra et al. ................. 356/123 |
| 6,191,423 | B1 | * | 2/2001 | Krijn et al. ................. 250/396 R |
| 6,246,058 | B1 | * | 6/2001 | Tiemeijer ................... 250/396 R |

(Continued)

FOREIGN PATENT DOCUMENTS

| JP | 2007180013 | 7/2007 |
| WO | 2003032351 | 4/2003 |

OTHER PUBLICATIONS

Heckman et al, The reduction of error in magnification determination in electron microscope, Electron Microsopy, Fifth International Congress Aug. 29, 1962-Sep. 5, 1962 Philadephia, PA, USA, vol. 1, 1962.*

(Continued)

*Primary Examiner* — Andrae S Allison
(74) *Attorney, Agent, or Firm* — Scheinberg & Associates, PC; Michael O. Scheinberg; John B. Kelly

(57) ABSTRACT

The invention relates to a method of determining the distortions in the projection system of a TEM, and a method of correcting for these aberrations. The aberrations are determined by collecting a large number of images of a sample, the sample slightly displaced between each acquisition of an image. On the images sub-fields (303, 304-*i*) showing identical parts of the sample are compared. These sub-fields (303, 304-*i*) will show small differences, corresponding to differential aberrations. In this way the differential aberrations in a large number of points can determined, after which the aberrations for each point can be determined by integration. By now correcting the position of each detected pixel in an image to be displayed, the displayed image has much reduced aberrations. An advantage of the method according to the invention is that no highly accurate steps of the sample are needed, nor is a sample with known geometry needed.

11 Claims, 5 Drawing Sheets

U.S. PATENT DOCUMENTS

| | | | |
|---|---|---|---|
| 6,552,340 | B1 | 4/2003 | Krivanek et al. |
| 7,378,667 | B2 * | 5/2008 | Henstra .................... 250/396 R |
| 7,518,121 | B2 | 4/2009 | Maas et al. |
| 7,544,939 | B2 * | 6/2009 | van der Zande et al. ..... 250/311 |
| 7,755,046 | B2 * | 7/2010 | Kohashi et al. .............. 250/311 |
| 2007/0125945 | A1 * | 6/2007 | van der Zande et al. ..... 250/307 |
| 2008/0093551 | A1 * | 4/2008 | Tsuneta et al. ................ 250/310 |
| 2008/0290264 | A1 | 11/2008 | Henstra et al. |

OTHER PUBLICATIONS

Kaynig, V.; Fischer, B.; Buhmann, J.M.; , "Probabilistic image registration and anomaly detection by nonlinear warping," Computer Vision and Pattern Recognition, 2008. CVPR 2008. IEEE Conference on , vol., No., pp. 1-8, Jun. 23-28, 2008.*

Carson, K.R et al "An Improved Standard Specimen for Alignment of Electron Microscopes" J.Sci. Instrum., 1967 vol. 44, 1036-1037.

Canemco "Scanning Electron Microscopy Supplies" webpages www.canemco.com 1-33pp.

Hashimoto et al., Pseudo-aberration Free Focus Condition for Atomic Resolution Electron Microscope Images, Micron, 1998, vol. 29, No. 2-3, pp. 113-121.

Hue, F., et al, 'Calibration of Projector Lens Distortions for Quantitative High-Resolution TEM,' Microsc Microanal, 2005, pp. 552-553, vol. 11, Suppl 2.

Kaynig, V. et al., 'Probabalistic Image Registration and Anomaly Detection by Nonlinear Warping,' Computer Vision and Pattern Recognition, Jun. 23, 2008, pp. 1-8.

Heckman, F.A. et al, 'The Reduction of Error in Magnification Determination in Electron Microscopes,' Electron Microscopy Conference & Database Inspec., Sep. 5, 1962, 2 pgs.

Lowe, David G., 'Distinctive Image Features from Scale-Invariant Keypoints,' International Journal of Computer Vision, Nov. 1, 2004, pp. 91-110, vol. 60, No. 2.

* cited by examiner undistorted reference grid reference grid showing spiral distortion

METHOD FOR DETERMINING DISTORTIONS IN A PARTICLE-OPTICAL APPARATUS

The invention pertains to a method for determining distortions in a particle-optical apparatus, said apparatus equipped with: a particle source for producing a beam of particles along a particle-optical axis, an object holder for holding an object, said object holder capable of translating an object placed in said object holder, a projection system for forming an image of said object, and a detector for acquiring and storing the image of the object, the method comprising the steps of providing an object, acquire a first image, and determining the distortions.

This method is disclosed in "Calibration of projector lens distortions for quantitative high-resolution TEM", F. Hue et al., Microsc. Microanal. 11 (supplement 2), 2005, pages 552-553, (DOI:10.1017/S143192760551081X), and is used to correct the distortions introduced by the projection system of a Transmission Electron Microscope (TEM).

In a particle-optical apparatus such as a Transmission Electron Microscope (TEM) an object, also referred to as a sample, is irradiated with a beam of electrons, the electrons having an energy of e.g. between 50 keV and 400 keV. Some of the electrons are transmitted through the sample, and these electrons are focused on the image plane to form an enlarged image of the sample. The imaging of the sample on the image plane is realized with a projection system, that can be set to a configurable magnification of e.g. between $10^3$ and $10^6$ times. Typically a detector, such as a fluorescent screen or a CCD camera, is placed in the image plane, whereby the image is detected.

As known to the person skilled in the art a projection system not only forms an image of the sample to the image plane, but also introduces aberrations and distortions. In this context aberrations are the errors resulting in a point to be imaged as a blur, and distortions are those errors that result in a warp of the image.

Distortions of the image may limit the performance of e.g. a TEM. Three examples where distortions are likely to limit the performance of a TEM are tomography, strain analysis and the stitching of images together to form a composite image.

For the construction of a 3D representation of a sample by tomography a large number of images, typically between 50 and 100 images, are made. Each image corresponds with a slightly different orientation (tilt) of the sample. By combining these images a 3D reconstruction can be formed. When the images are warped, due to distortions, the location of a feature in the sample with respect to a reference point in the sample is mis-represented. As in some images the feature may be in the centre of the image, and in other images the feature may be removed from the centre, the displacement is not constant, resulting in a blurring of the feature in the 3D reconstruction. This is aggravated by the fact that the magnification used in tomography is often relatively low, resulting in relative large distortions. Therefore in tomography distortion may limit the resolution in the 3D representation.

In strain analysis the warp of the lattice in a crystallographic sample is determined. As known to the person skilled in the art this warp may be the result of strain, and therefore determining the warp is a manner to determine the strain in the crystal. Obviously, if the image already shows warp for an unstrained crystal, this results in errors in the strain determined when imaging strained crystals.

Stitching of images is used to form a composite image with a large field of view from a number of images with a more restricted field of view. When stitching two images together, they will generally share a common seam where they border each other. The distortion in this seam will not be identical for the two images, and therefore the stitching will be flawed.

The aforementioned publication discloses that a sample in the form of a perfect crystal of silicon is inserted in a TEM. The location dependent displacements of the image of this perfect object are measured. It was found that the magnification over the field of view may vary as much as 5%, and that local rotation may be 2 degrees.

The publication proposes to map the local displacements in a displacement field and therewith correct experimental images by displacing the pixels in the image, thereby forming a modified image in which the distortion is at least partially corrected. It was found that in this way the local magnification error was reduced from its original 5% to 0.1% and the local rotation error was reduced from its initial 2 degrees to 0.1 degrees.

The publication further mentions that the projector lens distortions are quite stable over a time period of at least four years.

A disadvantage of the known method is that the magnification must be sufficiently high to resolve the atoms of the perfect crystal. For lower magnifications this method cannot be used. This is explained as follows: assuming e.g. a 4000× 4000 pixel detector, such as a state of the art CCD camera system for a TEM, and a perfect silicon crystal with a lattice distance of 0.543 nm as an object, the known method can be used for a maximum field of view of the object of less than 1×1 $\mu m^2$. When using a lower magnification, imaging a larger part of the object, this method can thus not be used as the position of the atoms cannot be resolved anymore. Another problem at lower magnification is that a larger crystal without flaws must be used, which may be difficult or impossible.

The invention intends to provide a method that can also determine distortions at lower magnification.

For this purpose the method according to the invention is characterized in that in the first image a sub-image is defined, the first sub-image showing a small part of the object; a series of images is acquired, the object being translated between each of the acquisitions; the realized translation between the images is determined; in each of the images a sub-image showing the small part of the object is identified; the sub-image distortion of each of the sub-images with respect to each other is determined; and the sub-image distortion of each of the sub-images is used to determine the distortion of the image.

The invention is based on the insight that the distortion varies over the field of view of the apparatus (and thus over the image). Therefore sub-images at different positions within the image will show different sub-image distortions. In other words: a part of the object that is imaged as e.g. a square at one position, will be warped when it is shifted and imaged at another part of the image. In first order approximation a square is warped into a rectangle that may be rotated over an angle. Thus, by collecting a large number of sub-images, each showing the same part of the object, and comparing the sub-images with each other, the sub-image distortion for each of these sub-images can be determined as a function of the position of each of these sub-images. The sub-image distortions are the result of the differential effects of the image distortion, and therefore the distortion of the image can then be found using these sub-image distortions.

It is noted that, as long as the small part of the object comprises sufficient detail to recognize it in the image, and sufficient detail to determine the distortions (this could be as little as three points), no prior knowledge of the object is needed.

It is further noted that the shift of the object need not be a predetermined shift, but that it may be any shift that results in the small part of object being imaged in a part of the image where it has not yet been. This is particularly important for using this method, as the object holders may not be accurate enough to realize a shift with an accuracy that corresponds with one pixel at the detector.

The shift may be determined by searching for the position of the sub-image in each of the images, but may also be derived from the image as a whole. Especially correlation is well suited for determining the shift of the image as a whole. To reduce the time needed for determining the shift, the correlation may be performed on a reduced number of pixels of the image.

It is remarked that, should the small part of the object be imaged on approximately the same part of the image twice, either the two sets of sub-image distortions can be used to improve the accuracy, or one of the two can be neglected.

The method according to the invention differs from other methods in which an object is made in which a diaphragm with a known pattern is used, such as grids and calibration samples for TEM's.

It is remarked that these samples are mostly made using lithographic techniques, and that the smallest details nowadays are typically larger than 25 nm large. From such a detail a pattern must then be made, and therefore this does not give good results for a field of view much less than 10×10 µm. As the atomic standard of the earlier mentioned method end at a field of view of at most 1×1 µm (more likely 250×250 nm), the known methods leave a gap which the method according to the invention fills.

In an embodiment of the method according to the invention the method further comprises providing another object, forming an image of the other object, and correcting the image of the other object for distortions.

By using the distortions to correct images made from other objects, an image with reduced distortions can be made of this other object. The correction can take the form of shifting pixels or sub-pixels in the displayed image.

It is noted that in "Calibration of projector lens distortions for quantitative high-resolution TEM", F. Hue et al., Microsc. Microanal. 11 (supplement 2), 2005, pages 552-553, (DOI: 10.1017/S143192760551081X), it is mentioned that the distortion is constant over a long period of at least four years. This makes it worthwhile to determine the distortions once, even if this takes a relative long time, and to use this data to correct images of other objects.

In another embodiment of the method according to the invention the small part of the object is centred round the particle-optical axis on one image, and the distortion of the image is determined with the intersection of the particle-optical axis and the image as a reference point.

As known to the person skilled in the art many types of distortion show symmetry round the particle-optical axis and can be neglected on the particle-optical axis. Therefore in the case where the small part of the object is imaged round the particle-optical axis, the distortion of the sub-image will be small when compared to sub-image distortions at other positions.

It is noted that in particle-optical apparatus such as Transmission Electron Microscopes (TEM's) and Scanning Transmission Electron Microscopes (STEM's) often magnetic lenses are used that are centred round the particle-optical axis of the apparatus. Such magnetic lenses cause a rotation of the image round the particle-optical axis when their excitation is changed. This makes it particularly simple to identify the position of the reference point where the particle optical axis intersects the image.

In yet another embodiment of the method according to the invention the determined sub-image distortions comprise a change in magnification in a first and a second direction and a rotation of the sub-image, all as a function of the position relative to a reference point.

The change in magnification of the sub-image in two different directions (preferably perpendicular to each other) and the rotation of the sub-image are the first order sub-image distortions. Determining these sub-image distortions is found to suffice when using sub-images up to (0.1×0.1) times the size of the image.

In still another embodiment of the method according to the invention the sub-image distortions are used to construct a table or formula representing the distortion of the image as a function of the position in the image.

By forming a table of formula from which the distortion in the image can be derived, the distortion of any point of the image can be found easily. This makes it possible to quickly determine the shift that a detected pixel should get to be displayed at the correct position of a displayed image.

It is remarked that the distortion need not be determined for every point in the image (e.g. every pixel of the detector), but that it may be sufficient to give distortion parameters for an area in the image, or that e.g. interpolation or curve fitting using a small number of points can be used, etc.

In still another embodiment of the method according to the invention the sub-image distortions are determined at different magnifications of the projection system and/or different energies of the particles forming the beam of particles.

As known to the person skilled in the art the distortions of a projections system vary when varying the excitation of the projection system, e.g. when changing the energy of the particle beam, and/or when changing the diameter of the rays traversing through the projection system, e.g. due to different magnifications. By forming a multi-dimensional matrix with distortions and interpolating between the data thus found, distortions for different settings of the projection system can be found and thus corrected for.

In still another embodiment of the method according to the invention each image comprises multiple sub-images.

Each of the images comprises a sub-image that is centred round the particle-optical axis, and is thus deemed to be undistorted. Therefore a large series of sub-images can be found, each series corresponding with a centred sub-image in one of the images, each series containing a large number of sub-images.

For N images a number of N series can be identified, each series containing N sub-images, thus resulting in $N^2$ sub-images. This compares favourable to the number of N sub-images that can be expected when using only one sub-image per image. This has several advantages, all resulting in a higher throughput:
  reduced acquisition time,
  reduced number of movements of the object holder,
  reduced illumination time for the object, also resulting in
    lower damage/degradation of the object.

It is noted that some of the sub-images may, on some of the images, fall outside the field of view and can thus not be used. Therefore in reality the gain in images will be less than N.

BRIEF DESCRIPTION OF THE DRAWINGS

The invention is now described with reference to figures, in which the identical reference numerals denote corresponding elements. Here.

Distortions may be described as follows:
each point of the object can be described by a complex value $$u=(x+iy)=re^{i\phi}$$

and each corresponding point of the image is then represented by the complex value $$U=(X+iY)=A_{10}u+A_{01}\bar{u}+A_{20}u^2+A_{11}u\bar{u}+A_{02}\bar{u}^2+\ldots$$
$$=\Sigma A_{n,m}u^n\bar{u}^m$$

In this formula the coefficient $A_{10}$ describes the magnification and rotation of the image, and the coefficients of all other terms describe distortions. As an example, $A_{01}$ describes the distortion of a circle into an ellipse. Similarly, the real part of $A_{21}$ corresponds with barrel/pincushion distortion, while the imaginary part of $A_{21}$ describes the so-named anisotropic distortion, also known as spiral distortion. It is noted that the use of a projection system with multiple lenses each causing distortions, in which the distortion centres in general do not coincide, and each its own distortion coefficients, may result in complicated distortions in the image plane of the projection system.

Figure 1:
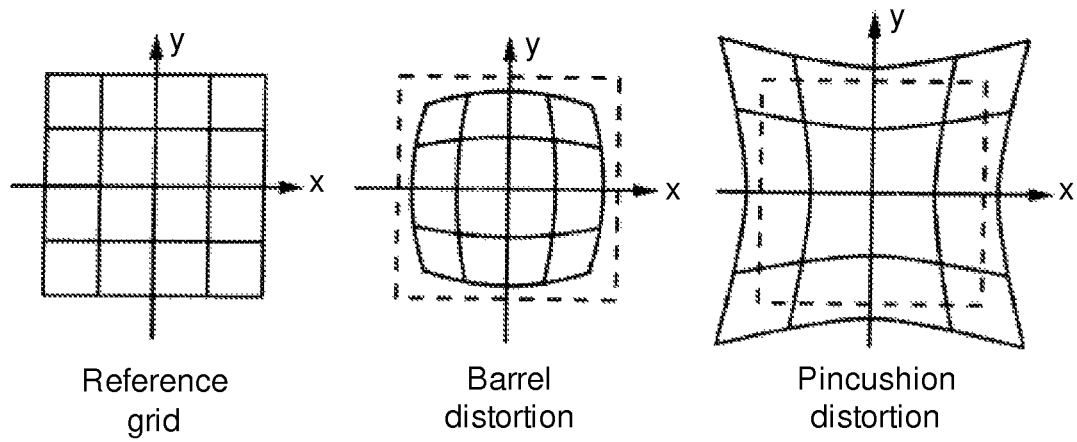
FIG. 1 shows examples of distortion as introduced by a projection system.

FIG. 1 schematically shows image distortion.

In FIG. 1 a reference grid, in the form of 5 horizontal and 5 vertical lines, is imaged by two systems, one system showing barrel distortion ($A_{21}<0$) and one system showing pincushion distortion ($A_{21}>0$). Barrel- and pincushion distortion are the most well-known distortions.

FIG. 2 shows the effect of anisotropic distortion, also known as spiral distortion.

Figure 2A:
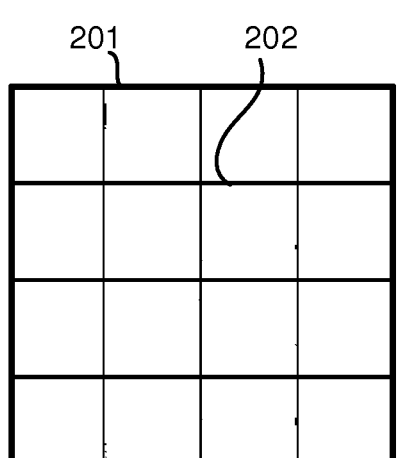
FIGS. 2A and 2B show example of distortion
Figure 2B:
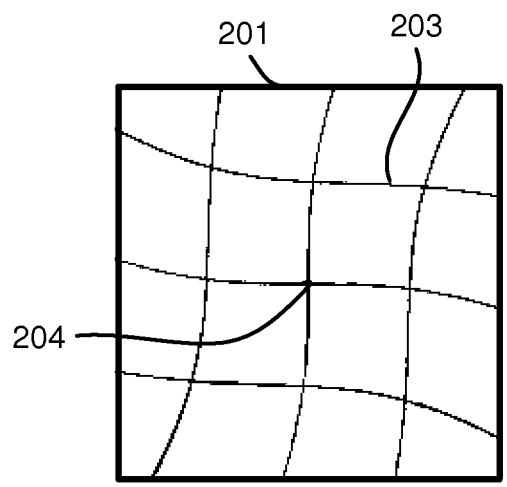

In FIG. 2 the effect of spiral distortion is shown. Spiral distortion is a distortion peculiar to magnetic lenses. Magnetic lenses are often used in electron-optical apparatus. The effect of spiral distortion is that an image point at a distance from the particle-optical axis is rotated to an amount proportional to the distance to said axis. FIG. 2A shows an undistorted reference grid 202 within a field-of-view 201, and FIG. 2B the reference grid imaged with spiral distortion, resulting in a distorted grid 203 within a field-of-view 201. It is noted that spiral distortion equals zero round the particle-optical axis or rotation centre 204.

Figure 3A:
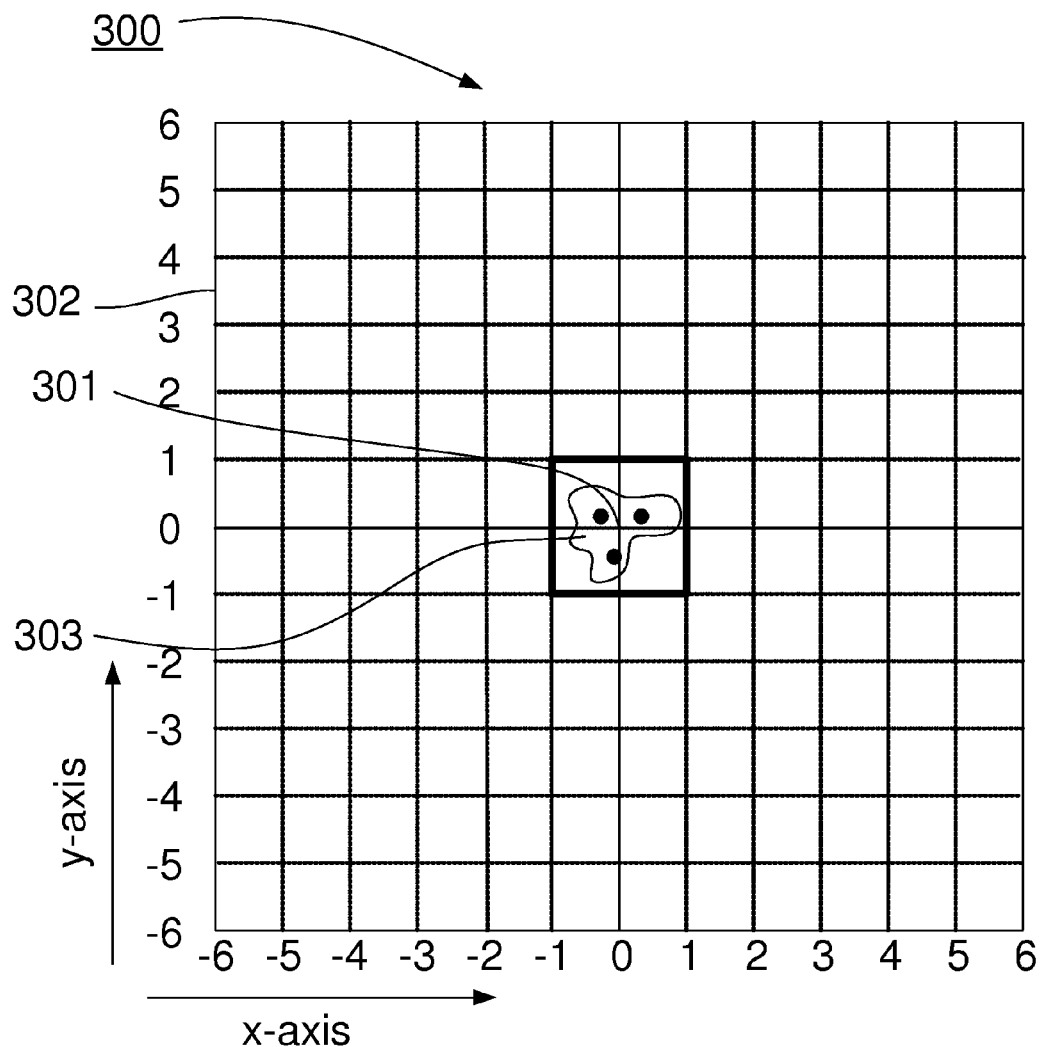

FIG. 3A schematically shows an image 300 centred round optical axis 301 and defined by a field of view 302. Within the image a sub-image 303 is identified, that in this image is centred round the particle-optical axis 301.

Figure 3B:
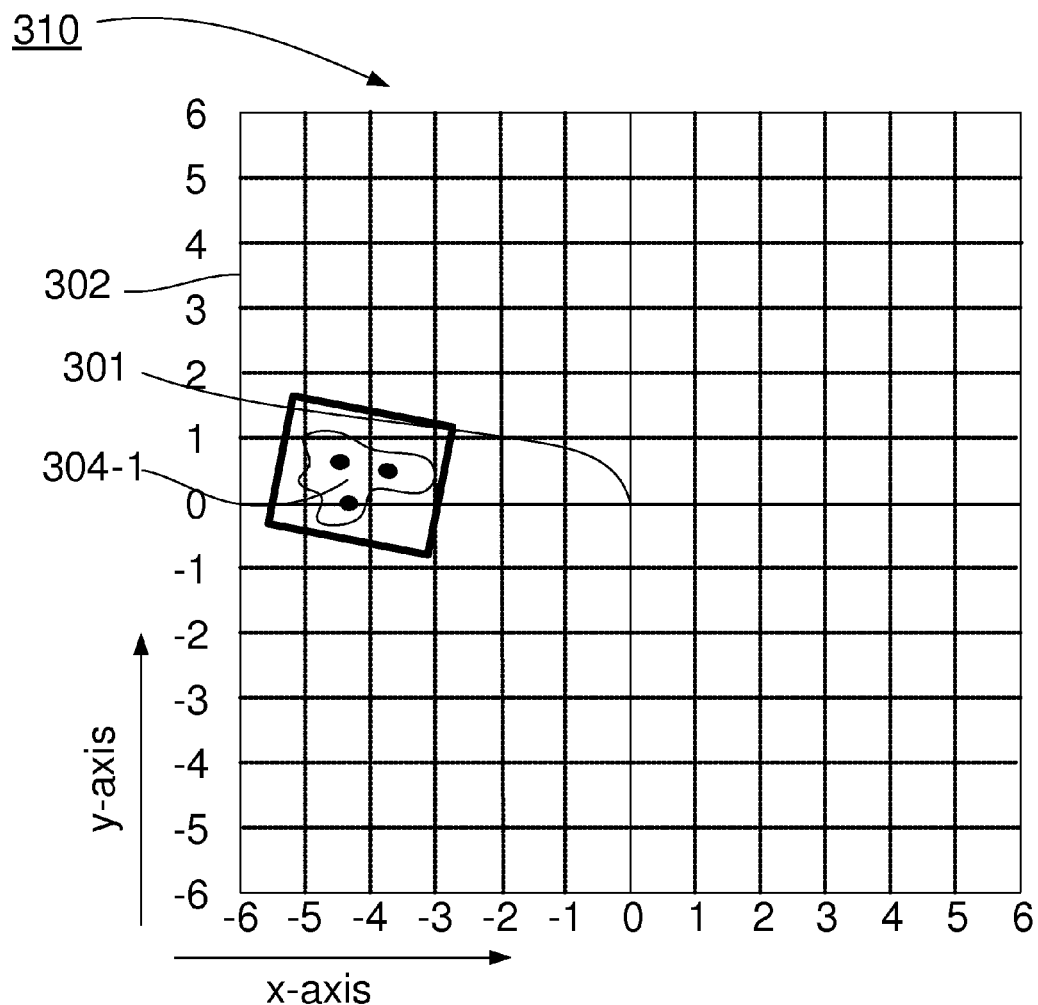

FIG. 3B shows another image 310, in which the object is slightly shifted. Due to distortions the sub-image 304-1 is slightly warped, which in first approximation can be described by a rotation and a change in magnification in the x and y direction when compared to the original sub-image shown in FIG. 3A.

It is noted that the shift can be determined in several ways, including correlation of the whole image, identifying the sub-image, or by other means that may include read-out of the object carrier by e.g. an optical interferometer, capacitative measurements, etc.

Figure 3C:
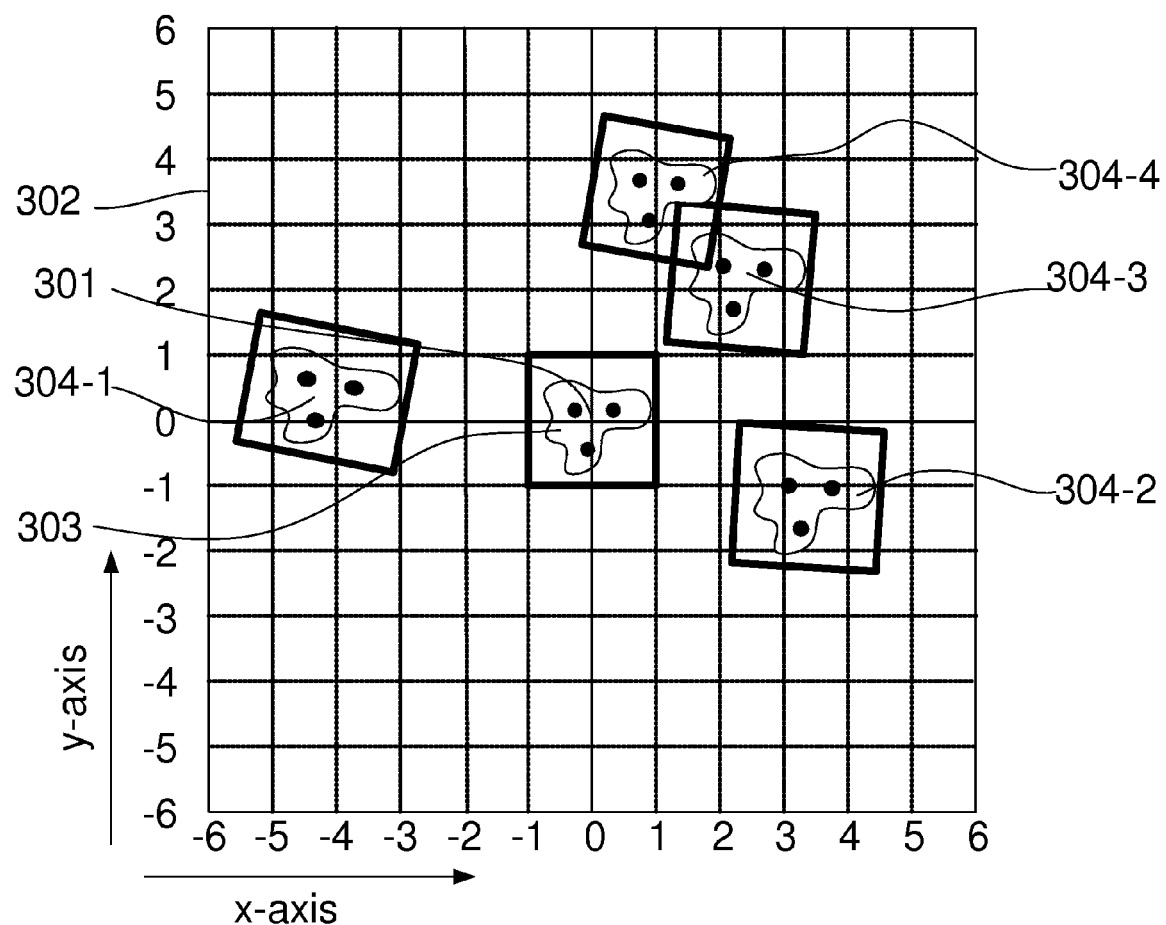

By collecting the distortion parameters for a large number of locations 304-i, as shown in FIG. 3C, the distortions anywhere in the field-of-view can be determined. It is noted that the distortions will often show symmetry round the particle-optical axis, so that the parameter for missing locations can be derived from the parameters of other points.

The distortion for a specific point can now be determined by integrating the distortions for each of the points between the axis and the specific point, taking into account e.g. the curving of the path due to spiral distortion.

Figure 4:
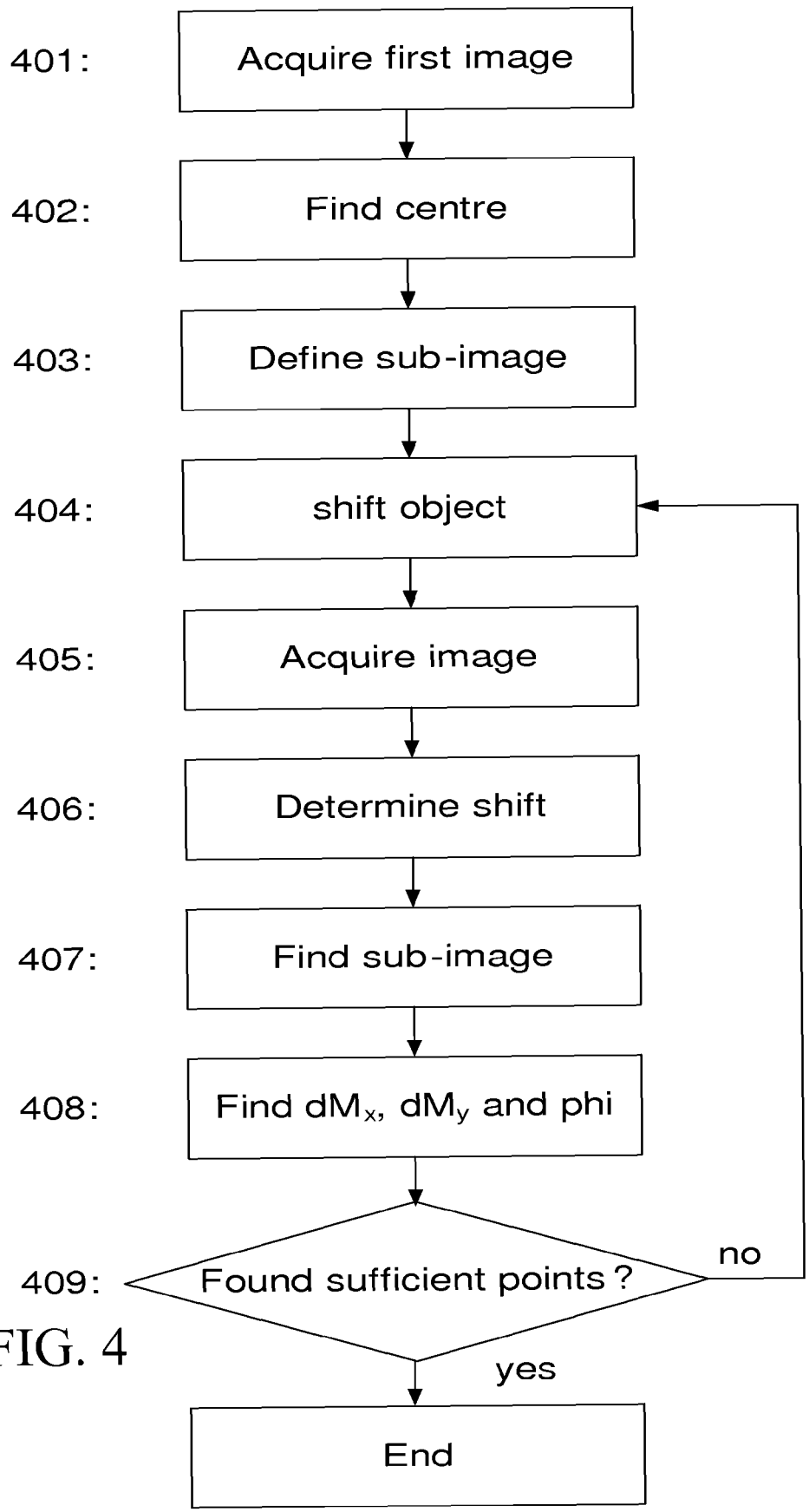

FIG. 4 schematically shows a flowchart for determining the sub-image distortions.

In first step 401a first image is acquired.

In step 402 the intersection of the particle-optical axis and the image plane is determined, e.g. by changing the excitation of the projection system, also known as "wobbling" of the projection system.

In step 403 a sub-image surrounding the centre is defined. This sub-image must contain some well defined structures. Further the sub-image must be sufficiently large to detect a small rotation of the sub-image due to distortions, but sufficiently small to be distortion free over the size of the sub-image. Inventors found that for a modern TEM with a 4000× 4000 pixel camera system a sub-image size of between 64×64 and 512×512 pixels, gave good results.

In step 404 the object is shifted. Preferably the accuracy of the shift function of the object holder is such that it is ascertained that the sub-image is kept within the field-of-view.

In step 405 an image is acquired.

In step 406 the shift of the image with respect to the first image is determined. As mentioned before this can be done by correlation of the images, either with the full number of pixels available or with a reduced number of pixels, or it can be determined by looking for the sub-image and determining the shift between the sub-image and the centre of the first image. Also other means can be envisioned, such as with the aid of optical interferometry, etc.

It is noted that a rotation of the object is for modern object holders unlikely. If this might be the case, such a rotation can also be determined for the image as a whole and corrected for.

In step 407, with a known shift from centre to new position, the sub-image is identified.

In step 408 the distortions of the sub-image are determined. It is noted that a first approximation of $\delta Mx$, $\delta My$ and $\phi$ is often sufficient to describe the distortions. Inventors found that it was sufficient to determine $\delta M$ and $\phi$, although it might be that for some systems both $\delta Mx$ and $\delta My$ should be determined separately.

In step 409 it is determined whether sufficient points are gathered. This depends on the number, but also on the spread of the points over the field-of-view. If there are not enough points yet, a next shift is made in a subsequent step 404.

It is noted that for best results the image shows an object with high contrast and high detail. This can be accomplished by e.g. a biological object stained with a heavy metal, such as osmium or tungsten. Also the use of gold particles, e.g. in the form colloidal particles or in the form of organometallic particles, comprising e.g. gold and a protein, in conjunction with a biological sample results in such a high contrast, high detail image.

A method of reconstructing the distortion in the image from the measured sub-image distortions is as follows:

For a distorted point the distortion can be derived by going to the centre (the place where the particle-optical axis intersects the image plane) whilst integrating the distortions of the sub-fields in the path. In good approximation this is the addition of the distortions when going from the distorted point to the centre, so:
from a starting point make a step with length ds in the direction θ of the centre, corrected for the sub-field distortions δM and φ (so resulting in step size ds (1−δM) and in direction θ−φ). This corresponds in the corrected world with a step ds in direction θ. From this new position this is repeated until the centre is reached. It is now known where in the corrected world the distorted pixel should be imaged. In this way the displayed location of a detected point can be changed so as to cancel the distortion in the detected image, and an image can be build that is free of distortion or at least shows much reduced distortion.

It is noted that the above method works well when the centres of the sub-fields form a relatively dense grid in the field of view. For positions that do not coincide with a centre of a sub-field the distortion values can be derived by interpolating the values of the scaling $\delta M$ and rotation $\phi$ from nearby points, e.g. by Delaunay triangulation.

It is further noted that, when aspects of the distortions of system are already known, this knowledge can be used to improve the accuracy of distortion. When it is e.g. already known that the anisotropic distortion shows symmetry round the particle-optical axis, then the rotation error $\phi$ in the distortion field [so: $\phi(x,y)$] can be approximated by a e.g. polynomial or a spleen function.

It is worth mentioning that, when the distortions of the sub-fields are expressed as polynomials or spleen function, the distortion for each position can be estimated by direct integration of said functions.

It is remarked that interpolation of distortion values may also take the form of interpolation between distortion values for different settings of the projection system.

We claim as follows:

1. A method for determining the distortion of an image of an object from sub-image distortions, comprising:
   acquiring a first image;
   determining the centre of the image by the intersection of the particle-optical axis and the image plane;
   defining a sub-image adjacent to the centre of the image, the sub-image including a portion of the object;
   shifting the object;
   acquiring a series of images, the object being shifted between each acquisition;
   determining a shift between each acquisition of the series of images with respect to the first image and/or between each subsequent image;
   identifying a sub-image in each acquisition of the series of images from each known shift, each sub-image including the portion of the object;
   determining the sub-image distortions of each acquisition of the series of images with respect to each other; and
   determining the distortion of the first image from the determined sub-images sub-image distortions.

2. The method of claim 1, wherein sub-images of each acquisition of the series of images include different sub-image distortions.

3. The method of claim 1, wherein determining the sub-image distortions of each acquisition of the series of images with respect to each other includes determining each sub-image distortion as a function of the position of each of the sub-images.

4. The method of claim 1, wherein the portion of the object includes at least three points that are recognizable in the image and/or sub-image.

5. The method of claim 1, wherein shifting the object results in the portion of the object being imaged in a part of the image where it has not yet been imaged.

6. The method of claim 1, wherein shifting the object results in the object being shifted by a predetermined amount or to a predetermined location.

7. The method of claim 1, further comprising:
   providing a second object;
   forming an image of the second object; and
   correcting the image of the second object for distortions.

8. The method of claim 1, wherein the determined sub-image distortions include a change in magnification in a first and a second direction and a rotation of the sub-image, all as a function of the position relative to a reference point.

9. The method of claim 8, wherein the first and second directions are perpendicular to each other.

10. The method of claim 1, further comprising constructing a table or formula from information gathered of the sub-image distortions, the table or formula representing the distortion of the image as a function of a position in the image, such that the distortion of any point of the image can be derived.

11. The method of claim 1, wherein determining the sub-image distortions includes determining the sub-image distortions at different magnifications of the projection system and/or different energies of the particles forming the beam of particles.

* * * * *